United States Patent
Hecht et al.

(10) Patent No.: US 7,932,745 B2
(45) Date of Patent: Apr. 26, 2011

(54) INVERTING FLIP-FLOP FOR USE IN FIELD PROGRAMMABLE GATE ARRAYS

(75) Inventors: Volker Hecht, Barsinghausen (DE); Fei Li, Santa Clara, CA (US); Jonathan W. Greene, Palo Alto, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/879,306

(22) Filed: Sep. 10, 2010

(65) Prior Publication Data

US 2010/0327906 A1 Dec. 30, 2010

Related U.S. Application Data

(62) Division of application No. 12/360,948, filed on Jan. 28, 2009, now Pat. No. 7,816,946.

(60) Provisional application No. 61/025,012, filed on Jan. 31, 2008.

(51) Int. Cl.
*G06F 7/38* (2006.01)
*H03K 19/177* (2006.01)

(52) U.S. Cl. ............... 326/40; 326/38; 326/39

(58) Field of Classification Search .......... None
See application file for complete search history.

(56) References Cited

U.S. PATENT DOCUMENTS

| | | | |
|---|---|---|---|
| 4,638,183 A | 1/1987 | Rickard et al. | |
| 5,495,182 A | 2/1996 | Hardy | |
| 5,502,403 A | 3/1996 | Liu et al. | |
| 5,583,451 A | 12/1996 | Sharpe-Geisler | |
| 5,621,338 A | 4/1997 | Liu et al. | |
| 5,635,856 A | 6/1997 | Raza et al. | |
| 5,796,624 A | 8/1998 | Sridhar et al. | |
| 6,121,797 A | 9/2000 | Song et al. | |
| RE37,577 E | 3/2002 | Liu et al. | |
| 6,466,049 B1 | 10/2002 | Diba et al. | |
| 6,477,695 B1 | 11/2002 | Gandhi | |
| 6,785,875 B2 | 8/2004 | Beerel et al. | |
| 6,993,737 B1 | 1/2006 | Anderson et al. | |
| 7,816,946 B1 * | 10/2010 | Hecht et al. | 326/40 |
| 2007/0007996 A1 | 1/2007 | Ranganathan | |
| 2007/0136706 A1 | 6/2007 | Hwange et al. | |
| 2010/0192117 A1 | 7/2010 | Zhu et al. | |

OTHER PUBLICATIONS

Co-pending U.S. Appl. No. 11/859,678, filed Sep. 21, 2007 entitled Architecture and Method for Compensating for Disparate Signal Rise and Fall Times by Using Polarity Selection to Improve Timing and Power in an Integrated Circuit.

(Continued)

*Primary Examiner* — Anh Q Tran
(74) *Attorney, Agent, or Firm* — Lewis and Roca LLP

(57) ABSTRACT

A flip-flop for use in a field programmable gate array integrated circuit device is disclosed. The flip-flop comprises a data output terminal coupled to a first programmable routing element, a data input terminal coupled to a second programmable routing element, and a clock input terminal, wherein a signal appearing at the data output terminal in response to a signal applied to the clock input terminal has the opposite logical polarity with respect to the corresponding logical signal applied to the data input terminal.

15 Claims, 12 Drawing Sheets

OTHER PUBLICATIONS

Office Action mailed Nov. 17, 2009 in co-pending U.S. Appl. No. 11/859,678, filed Sep. 21, 2007.

Anderson, J. H. et al., "Active Leakage Power Optimization for FPGAs", Proceedings of the 2004 ACM/SIGDA 12th International Symposium on Field Programmable Gate Array, 2004, pp. 33-41, Monterey, California, USA.

Zhu, Kai, "Post-Route LUT Output Polarity Selection for Timing Optimization", Proceedings of the ACM/SIGDA 15th International Symposium on Field Programmable Gate Arrays, FPGA 2007, Feb. 18-20, 2007, held in Monterey, California, USA, pp. 89-96, ACM Press, 2007.

* cited by examiner

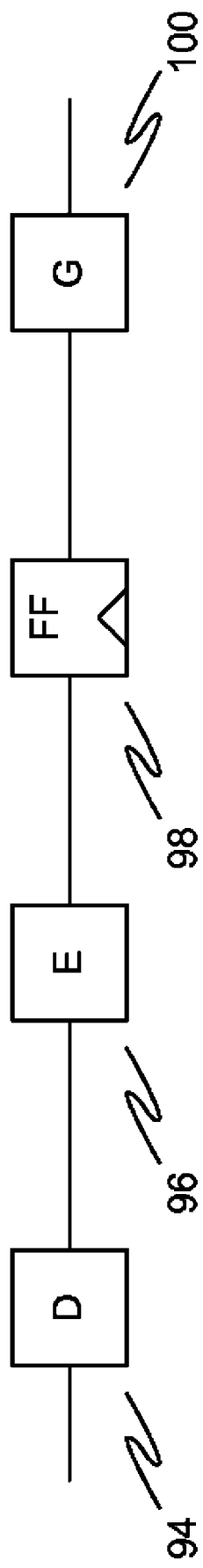
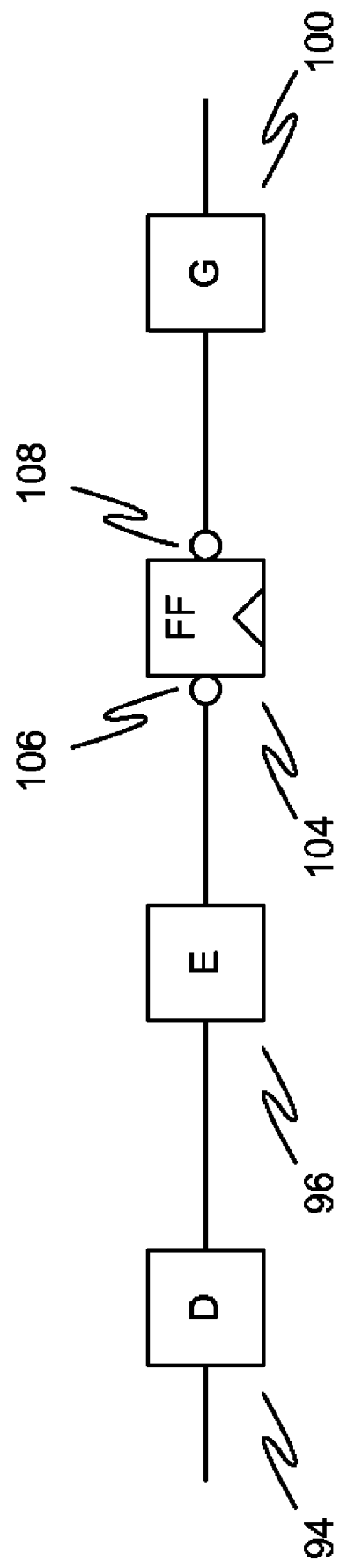
FIGURE 10A
FIGURE 10B

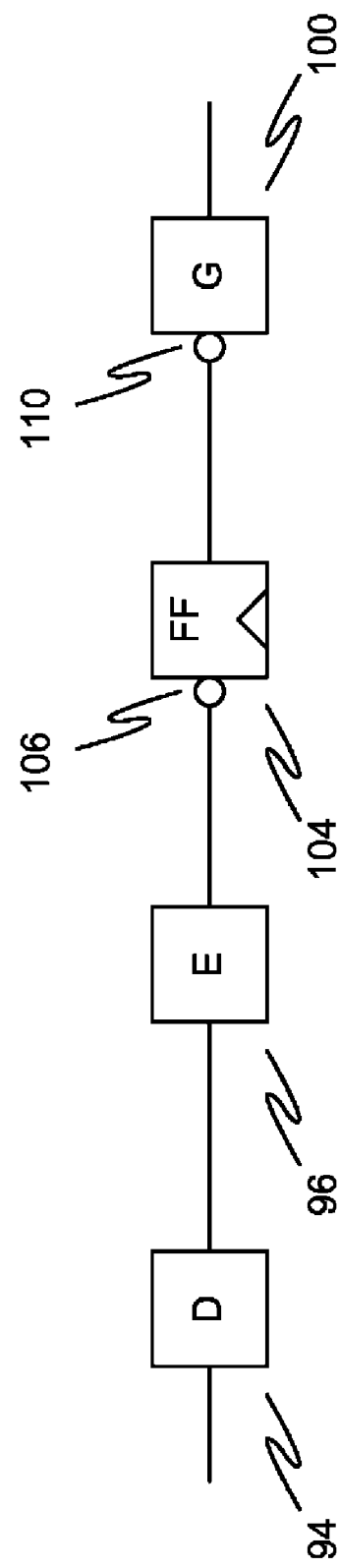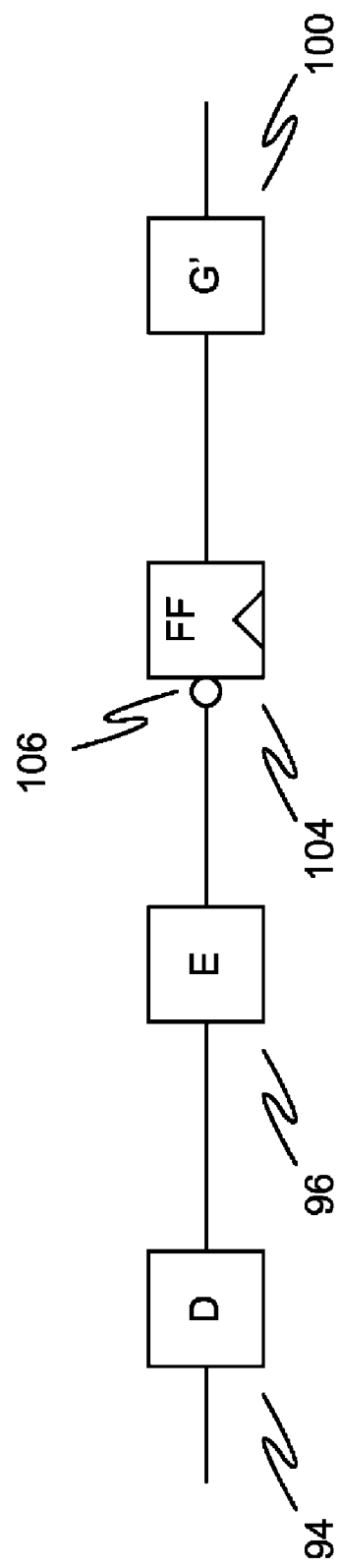
FIGURE 10C
FIGURE 10D

INVERTING FLIP-FLOP FOR USE IN FIELD PROGRAMMABLE GATE ARRAYS

REFERENCE TO RELATED APPLICATIONS

This application is a divisional of co-pending U.S. patent application Ser. No. 12/360,948, filed Jan. 28, 2009, which claims the benefit of U.S. Provisional Application Ser. No. 61/025,012 filed Jan. 31, 2008, both of which are hereby incorporated herein by reference.

BACKGROUND OF THE INVENTION

1. Field of the Invention

The Present invention relates to integrated circuit devices. In particular, it relates to field programmable gate array integrated circuit devices.

2. The Prior Art

Field Programmable Gate Array (FPGA) integrated circuit devices are known in the art. An FPGA comprises any number of initially uncommitted logic modules arranged in an array along with an appropriate amount of initially uncommitted routing resources. Logic modules are circuits which can be configured to perform a variety of logic functions like, for example, AND-gates, OR-gates, NAND-gates, NOR-gates, XOR-gates, XNOR-gates, inverters, multiplexers, adders, latches, and flip-flops. Routing resources can include a mix of components such as wires, switches, multiplexers, and buffers. Logic modules, routing resources, and other features like, for example, I/O buffers and memory blocks, are the programmable elements of the FPGA.

The programmable elements have associated control elements (sometimes known as programming bits or configuration bits) which determine their functionality. The control elements may be thought of as binary bits having values such as on/off, conductive/non-conductive, true/false, or logic-1/logic-0 depending on the context. The control elements vary according to the technology employed and their mode of data storage may be either volatile or non-volatile. Volatile control elements, such as SRAM bits, lose their programming data when the FPGA power supply is disconnected, disabled or turned off. Non-volatile control elements, such as antifuses and floating gate transistors, do not lose their programming data when the FPGA power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the logic modules and routing resources can vary greatly and are appropriate for the type of control element used.

Typically a user creates a logic design inside manufacturer-supplied design software. The design software then takes the completed design and converts it into the appropriate mix of configured logic modules and other programmable elements, maps them into physical locations inside the FPGA, configures the interconnect to route the signals from one logic module to another, generates the data structure necessary to assign values to the various control elements inside the FPGA, and program the FPGA if a programming head interfaced to an FPGA is present in the computer system.

The design software typically manipulates the user design in a variety of different ways. For example, the Boolean functions can be manipulated to optimally convert the design to programmable elements optimizing for maximum performance, for minimum area or minimum power. If logic modules and programmable routing elements have asymmetrical propagation delays for rising delays and falling delays, the logic polarity on a given signal can be adjusted to exploit this and the inverted polarity compensated for elsewhere. Similarly, if programmable elements have different static power in different logic states, the Boolean functions can be manipulated so that the circuit will spend most of its time in the lower power state with the manipulations required to do this being compensated for elsewhere.

Many FPGA architectures employing various different logic modules and interconnect arrangements are known in the art. Some architectures are flat while others are clustered. In a flat architecture, the logic modules may or may not be grouped together with other logic modules, but all of the logic modules have free access to the larger routing architecture.

In a clustered architecture, the logic modules are grouped together into clusters which typically have a two level hierarchy of routing resources associated with them. The first level typically makes interconnections internal to the cluster while the second level typically allows interconnections between clusters. FIG. 1 illustrates a block diagram of a prior art logic cluster which illustrates the basic principles of a clustered architecture. The logic cluster contains four logic modules each comprising a logic function generator circuit of a type sometimes called a look-up table (or LUT) each having four inputs which are designated LUT4 in the diagram. Each LUT4 has an associated flip-flop designated FF. Each flip-flop is a one-bit data storage element that has a data input, a data output, and a clock input. Data is transferred from the logic function generator coupled to the data input to the data output in response to the signal received at the clock input. The output of each LUT4 is coupled to the data input of the associated flip-flop. The output of each LUT4 and each flip-flop is coupled to the block designated Cluster Internal Routing Lines which is the first level of the routing hierarchy. The output of each LUT4 and each flip-flop is also coupled to the block designated External Horizontal & Vertical Routing Lines which is the second level of the routing hierarchy. The cluster input multiplexers, the LUT4 input multiplexers, the cluster internal routing lines, and the external horizontal and vertical routing lines are programmable routing elements. The data channel of each multiplexer selected and the use of each routing line is determined by control elements whose value is determined during the routing process by the design software and whose values typically do not change during normal operation.

As exemplified in FIG. 1, in many modern FPGAs functionality is provided by logic modules and flip-flops. Logic modules can be n-input look-up-tables or any other kind of function generators with n inputs, where n>1. The flip-flops can be simple D-type flip-flops, or they can have additional functionality such as CLEAR, RESET, LOAD, and ENABLE. These additional functions (with the exception of ENABLE) can be synchronous with the clock or asynchronous (or both.)

Logic modules and flip-flops are often grouped into clusters that may typically vary in size from four to more than twenty. The clustering provides no additional functionality; it is done for routing convenience. In addition to the functionality provided by the logic modules and flip-flops, the FPGAs may include other types of functional blocks such as multipliers, RAMs, FIFOs, etc.

The most common arrangement of logic modules and flip-flops is shown in FIG. 2. In this kind of arrangement, the Y output of logic module 10 directly drives the Di input of the flip-flop 12. Note that D is used to denote the "external" version of the data input and that Di is used to denote the "internal" versions of the data input. In FIG. 2, these are the same circuit node, but that will not be the case in some of the subsequent drawing figures.

The X1, X2, X3 and X4 data inputs of the logic module 10 are each driven by a multiplexer; multiplexer 14 drives data input X1, multiplexer 16 drives data input X2, multiplexer 18 drives data input X3, multiplexer 20 drives data input X4. Each of multiplexers 14, 16, 18 and 20 have a plurality of data inputs that are driven from routing tracks as is known in the art. Multiplexer 22 allows the Q output of flip-flop 12 to be used as an additional input to the X4 data input of logic module 10. The clock (CK) input of flip-flop 12 is driven by the output of multiplexer 24, which allows selection between the various clock resources at its data inputs. Multiplexers 14, 16, 18, 20, 22 and 24 are programmable routing elements. The data channel selected is determined by control elements whose value is determined during the routing process by the design software and whose values typically do not change during normal operation. The output Y of the logic module 10 and the output Q of the flip-flop 12 are coupled to other programmable routing elements not shown in the drawing figure.

The arrangement shown in FIG. 2 has been used in many different commercial products. This is an economical arrangement in terms of routing fabric usage, but it is also the most limited in terms of flexibly packing logic functions and flip-flops together. Unless the flip-flop is packed with the logic that drives it, the logic block functionality must be used as a feed-through buffer and is thus wasted. In typical FPGA designs, this limitation causes a large number of isolated flip-flops to be present that are not packed together with logic modules.

The packing limitations of the arrangement shown in FIG. 2 can be improved significantly by allowing configurable connections between the logic modules and the flip-flops, as shown in FIG. 3. An additional multiplexer 26 (also a programmable routing element) permits selection of the source of the D input to flip-flop 12 between the Y output of logic module 10 and the output of multiplexer 20 that drives the X4 input to the logic module 10 indirectly through multiplexer 22.

The arrangement shown in FIG. 3 is very commonly used in commercial products. As will be appreciated by persons of ordinary skill in the art, the logic module 10 in the arrangement of FIG. 3 is no longer wasted if the D-input of flip-flop 12 is not driven from its output. On average, this improves the packing efficiency by packing 20% more flip-flops with logic modules. However, even this arrangement has limitations when the logic module 10 does not drive the flip-flop 12. The total number of combined data inputs to the logic module 10 and to the flip-flop 12 must be "n", the same as the maximum number of inputs to the logic module. This either means that the logic module is used in a limited role by computing a logic function of n−1 inputs, or that one of the inputs of the logic module must be driven from the Q output of the flip-flop.

Even though the arrangement shown in FIG. 3 improves the packing density, the improvement comes with a small performance penalty due to the delay through the multiplexer 26 between the logic module 10 and the flip-flop 12. This is typically a small delay that is well worth the increase in packing density, as long as the multiplexer 26 remains a single-level multiplexer.

The flip-flop 12 shown in FIG. 2 and FIG. 3 is a simple D-type flip-flop. While many different additional functions like SET, RESET, etc., can be added to the flip-flop 12, of particular interest is the addition of an enable function because of its effects on the circuit topology. FIG. 4 shows the addition of the enable function by the addition of multiplexer 28 between multiplexer 26 and the Di input of flip-flop 12. The select line of multiplexer 28 is the enable (EN) signal. It is driven by multiplexer 30 which allows the selection of various routing resources at its data inputs. In the circuit of FIG. 4, the new complex flip-flop 32 with an enable is indicated by the rectangle drawn with a broken line. In this case, the Di input of the basic D-type flip-flop 12 and the D input of the complex flip-flop 32 are two different nodes in the circuit.

FIG. 5 shows some exemplary circuit detail of the complex flip-flop 32. Many different designs with flip-flops with an enable function are known in the art. In the complex flip-flop 32 are shown circuit details for multiplexer 28 and flip-flop 12. Multiplexer 28 comprises transmission gates 34 and 36 and inverter 38. The connections of the two transmission gates ensure that when one is open the other is closed. Thus depending on the value of the EN signal, either the output Q or the input D will be presented to the Di input of flip-flop 12.

Flip-flop 12 comprises two latches. The first latch comprises transmission gates 40 and 46 and inverters 42 and 44 while the second latch comprises transmission gates 50 and 56 and inverters 52 and 54. Inverter 48 is shared between the two latches.

In this configuration, data is transferred from the first latch to the second latch (and thus the output Q) on the rising edge of CK. When CK is at logic-1, transmission gates 40 and 56 are closed and transmission gates 46 and 50 are open. In this case, the first latch is isolated from multiplexer 28 and the feedback path comprising inverters 42 and 44 and transmission gate 46 is active, while the second latch receives the data stored in the first latch without conflict since the feedback path comprising inverters 52 and 54 and transmission gate 56 is inactive.

When CK is at logic-0, transmission gates 40 and 56 are open when transmission gates 46 and 50 are closed. In this case, the first latch receives the data output from multiplexer 28 and the feedback path comprising inverters 42 and 44 and transmission gate 46 is inactive, while the second latch is isolated from the first latch and the feedback path comprising inverters 52 and 54 and transmission gate 56 is active.

The enable function allows new data to be clocked into flip-flop 12 on the rising edge when the EN signal is at logic-1 and to hold the previous data by feeding it back to the flip-flop 12 when the EN signal is at logic-0. Thus when the flip-flop is "enabled" it can receive new data and when "disabled" it holds the old data.

One circuit issue present in the configuration in FIG. 4 is the long series connection of multiplexers 20, 26, 28, and the multiplexer formed by transmission gates 40 and 46 and inverter 48 that a signal must pass through before being buffered by inverter 42. Typically these multiplexers are constructed out of CMOS transmission gates (of the sort shown in FIG. 5), NMOS pass transistors, or floating gate flash transistors in flash-based FPGAs (which function much like NMOS pass transistors in this context). Multiplexer 20 can be particularly problematic, since it is part of the routing fabric. Typically it can be very wide (i.e., having many data inputs) and may even comprise two series stages of pass transistors or transmission gates. That means that a signal coming in through multiplexer 20 which is routed through multiplexers 26 and 28 to flip-flop 12 can potentially pass through four or five stages of pass transistors or transmission gates without buffering. This can cause a significant performance degradation in the circuit which can be unacceptable in a commercial product.

One possible solution is to insert a buffer somewhere in the path. Unfortunately, CMOS buffers require two inverting gain stages. While this will reduce RC delay through the pass transistors or transmission gates and the accompanying metal lines, it can introduce an unacceptable delay of its own.

BRIEF DESCRIPTION OF THE DRAWING FIGURES

FIG. 10A shows a second exemplary portion of an end user design.

FIG. 10B shows a first transformation of the portion of an end user design of FIG. 10A.

FIG. 10C shows a second transformation of the portion of an end user design of FIG. 10A.

FIG. 10D shows a third transformation of the portion of an end user design of FIG. 10A.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 6:
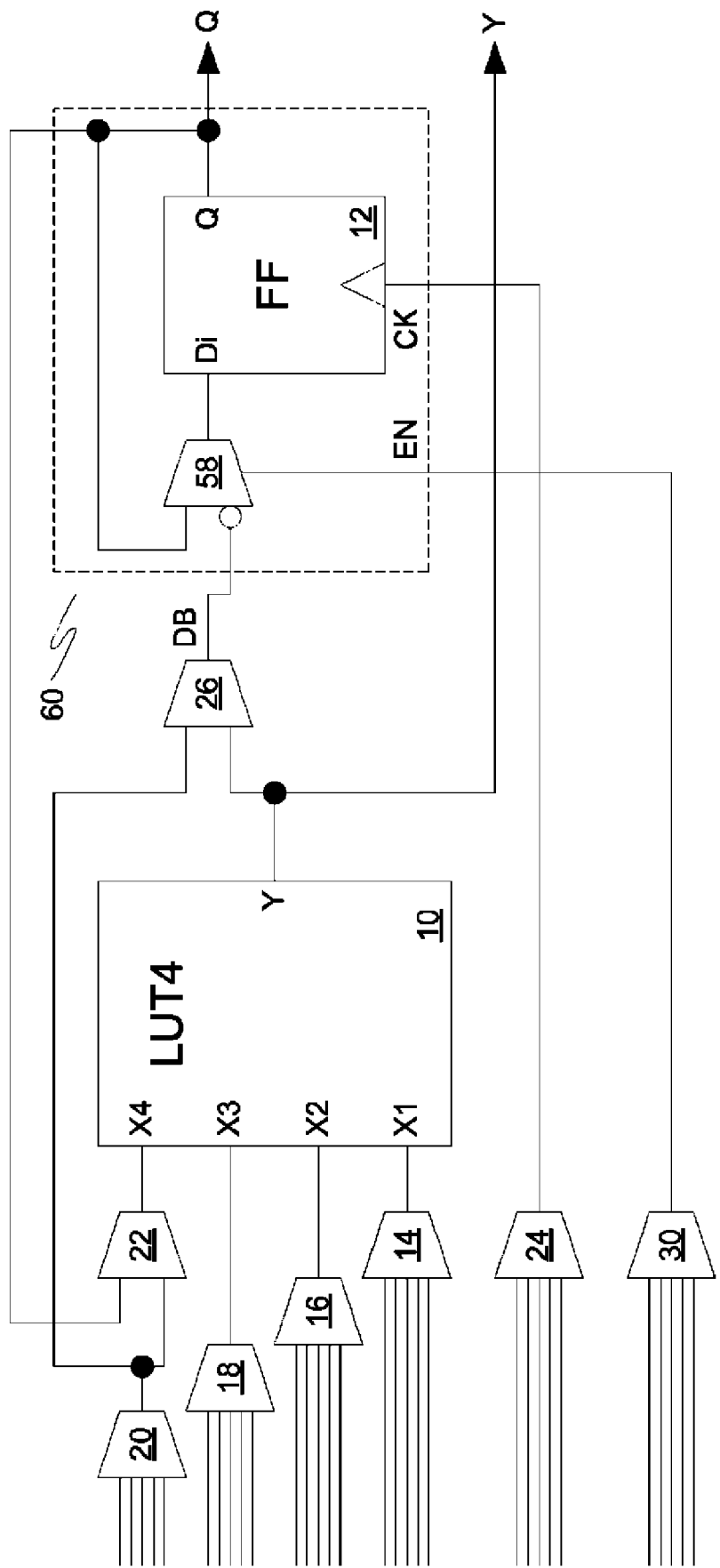
FIG. 6 shows a function generator in a configuration with a flip-flop of the present invention.

FIG. 6 shows an embodiment of an inverting flip-flop of the present invention. A function generator circuit is coupled to the data input of the flip-flop via a programmable routing element. The inverting flip-flop includes an inverting multiplexer (a multiplexer with one of its inputs logically inverted) in series with its data input signal. The inverting multiplexer causes the output signal from the flip-flop to have the opposite logical polarity from the data input signal. The inverting multiplexer also buffers the data input signal, providing a faster data input signal path than non-inverting flip-flops of the prior art.

Figure 1:
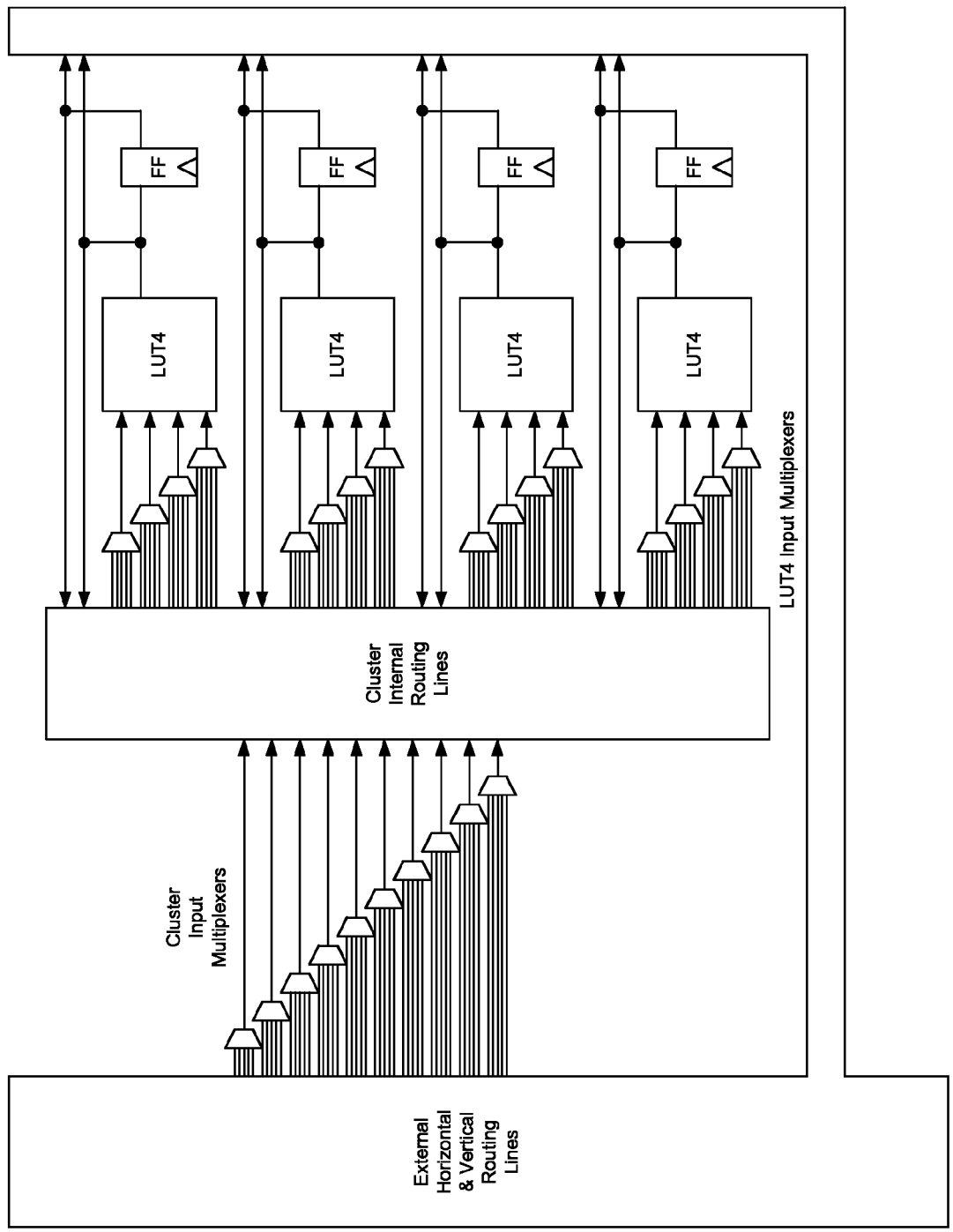
FIG. 1 shows a logic cluster of the prior art.
Figure 2:
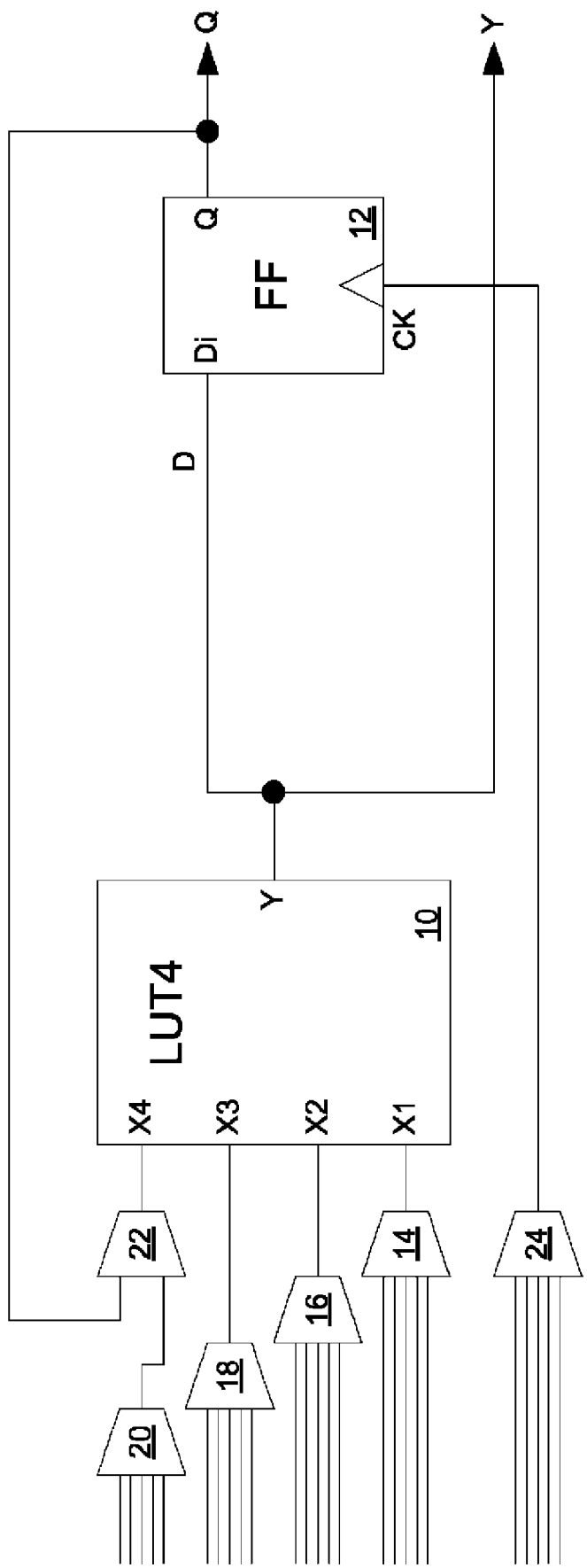
FIG. 2 shows a first function generator and flip-flop configuration of the prior art.
Figure 3:
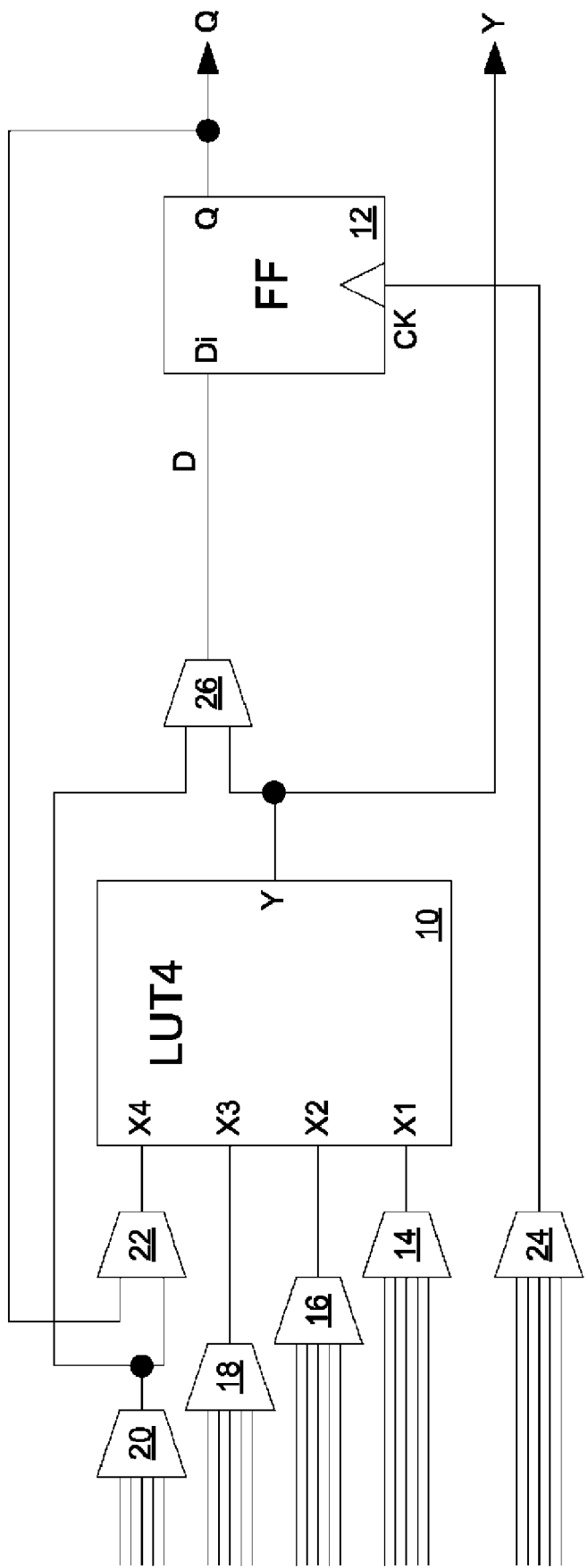
FIG. 3 shows a second function generator and flip-flop configuration of the prior art.
Figure 4:
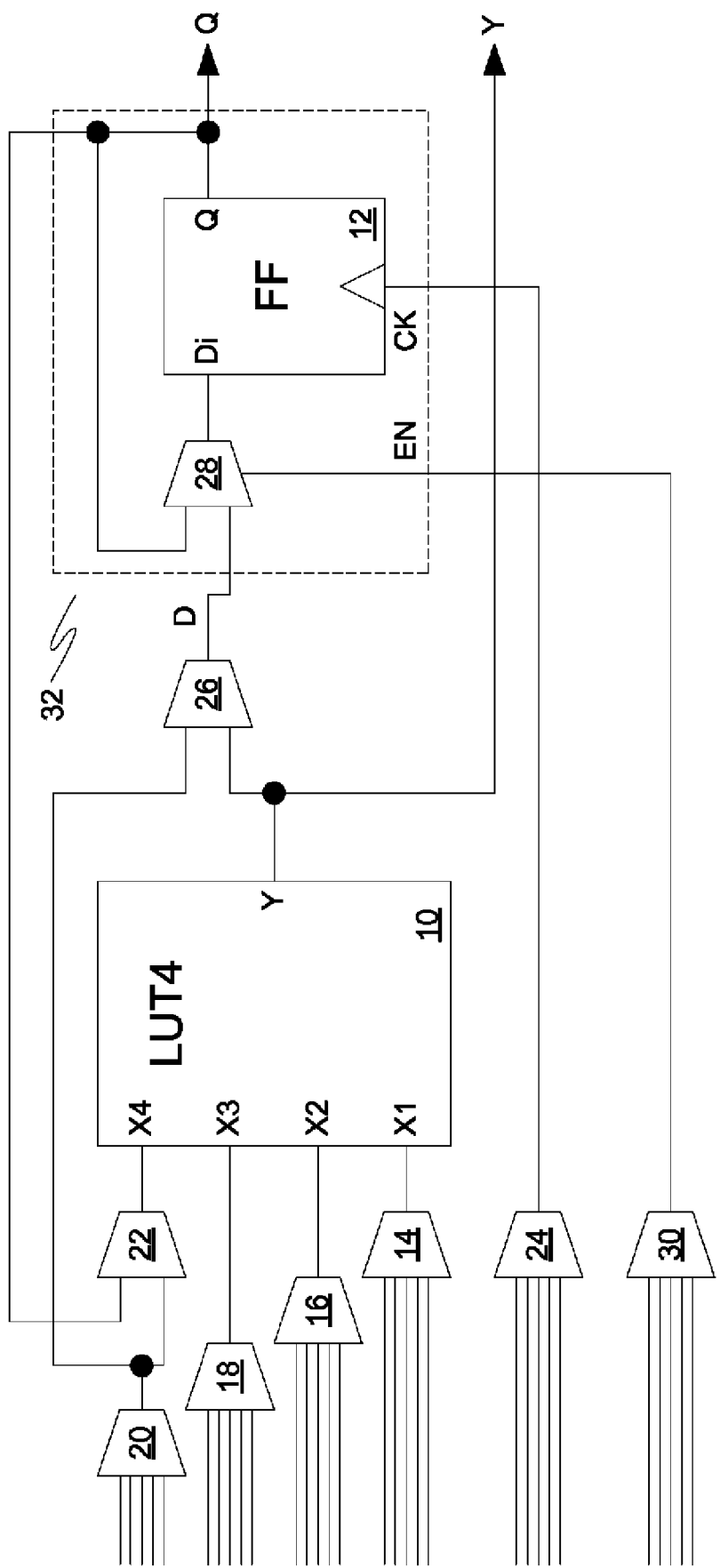
FIG. 4 shows a third function generator and flip-flop configuration of the prior art.

Present in FIG. 6 are function generator 10, flip-flop 12, and multiplexers 14, 16, 18, 20, 22, 24, 26 and 30 previously discussed. Also present in FIG. 6 is inverting multiplexer 58 which replaces multiplexer 28 of FIG. 4 and complex flip-flop 60 which replaces complex flip-flop 32 of FIG. 4. The output Y of the logic module 10 and the output Q of the flip-flop 60 are coupled to programmable routing elements not shown in the drawing figure.

Inverting multiplexer 58 is shown having an inversion on its data input that is coupled to the output of multiplexer 26. This indicates a logical inversion in the signal path. Correspondingly the input to the data input of complex flip-flop 60 is labeled DB in the diagram.

Figure 7:
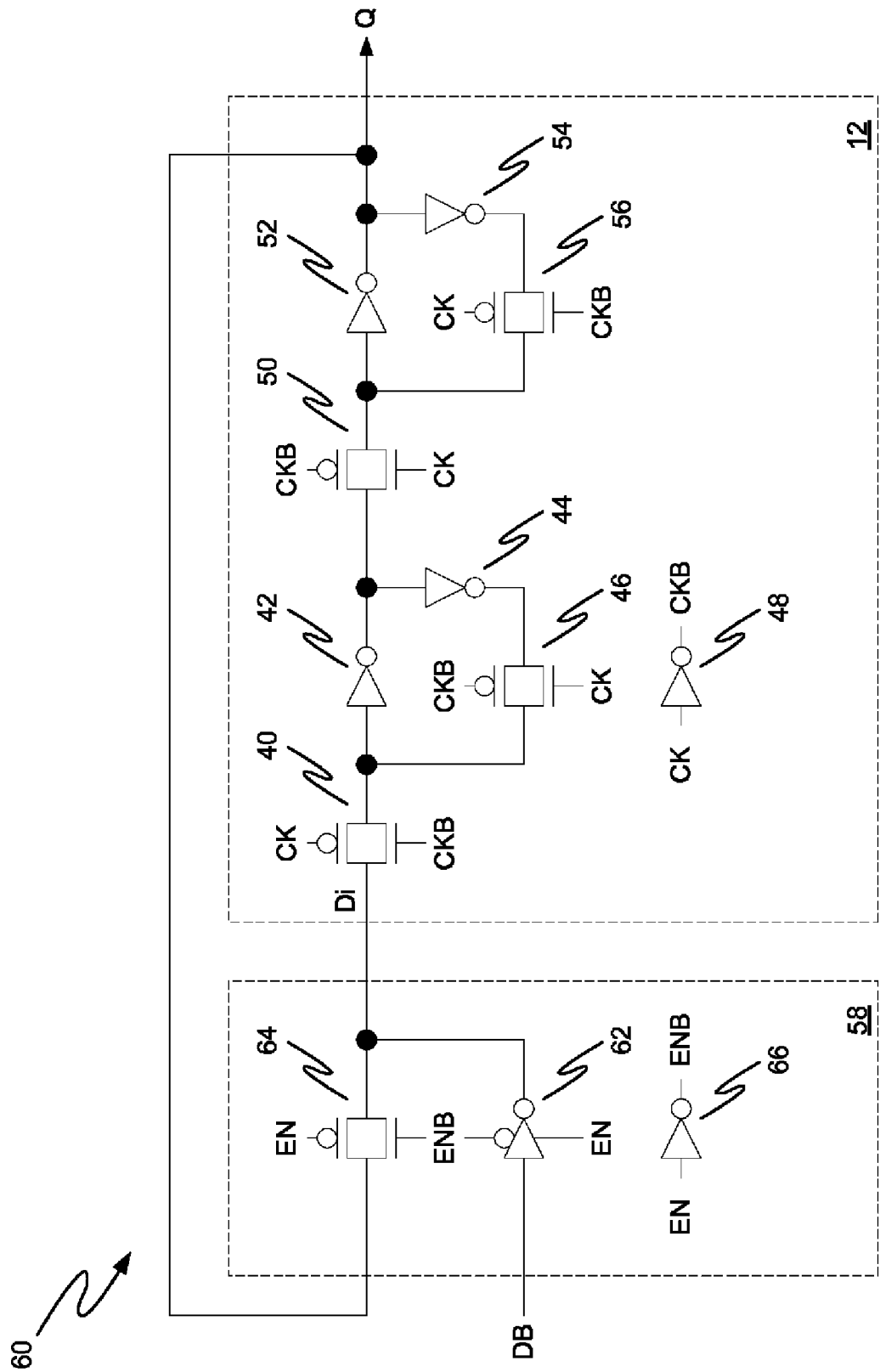
FIG. 7 shows exemplary circuit details of the flip-flop of FIG. 6.

FIG. 7 shows exemplary circuit details of complex flip-flop 60. Present in FIG. 7 is flip-flop 12 comprising transmission gates 40, 46, 50 and 56 and inverters 42, 44, 48, 52 and 54 previously discussed. Also present in FIG. 7 is inverting multiplexer 58 comprising tri-state inverter 62, transmission gate 64, and inverter 66.

Tri-state inverter 62 has a data input coupled to the DB input of complex flip-flop 60, a non-inverting enable input coupled to the EN input of complex flip-flop 60, an inverting enable input coupled to the output of inverter 66 (labeled ENB in the figure), and an output coupled to the output of transmission gate 64 and the input of transmission gate 40 (labeled Di in the figure). Transmission gate 64 has a data input coupled to the output of inverter 52, the input of inverter 54, and the output of complex flip-flop 60 (labeled Q in the figure), an inverting enable input coupled to the EN input of complex flip-flop 60, a non-inverting enable input (labeled ENB in the figure) coupled to the output of inverter 66, and an output coupled to the input of transmission gate 40 (labeled Di in the figure) and the output of tri-state inverter 62. Inverter 66 has an input coupled to the EN input of complex flip-flop 60 and an output coupled to the internal ENB signal.

When the EN signal is at logic-0, inverter 66 drives the ENB signal to logic-1. This causes tri-state inverter 62 to present high-impedance to node Di and causes transmission gate 64 to be open presenting the logic value on the node Q to the node Di. This corresponds to complex flip-flop 60 being disabled. When the EN signal is at logic-1, inverter 66 drives the ENB signal to logic-0. This causes tri-state inverter 62 to drive the complement of the logic value on the node DB to node Di and causes transmission gate 64 to be closed presenting high impedance to the node Di. This corresponds to complex flip-flop 60 being enabled.

Figure 5:
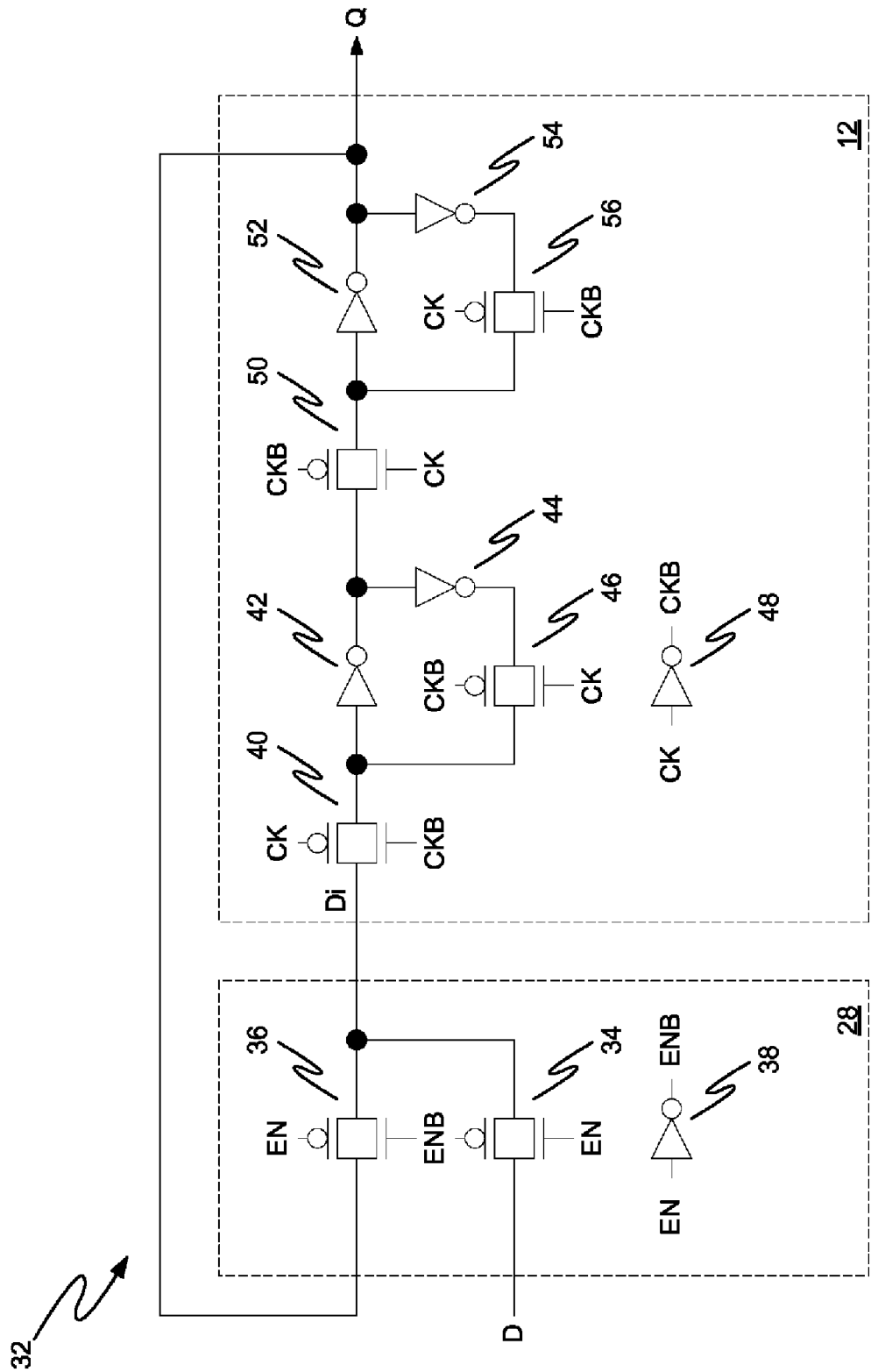
FIG. 5 shows circuit details of the flip-flop of FIG. 4.

The presence of tri-state inverter 62 breaks the long chain of pass transistors and transmission gates that can create a substantial amount of RC delay discussed in conjunction with FIG. 5. Tri-state inverter 62 acts as a buffer while only costing the delay of a single gain stage instead of the two gain stages required by a non-inverting buffer. This increases the speed of signal propagation through multiplexers 20, 26 and 58 and into flip-flop 12 in FIG. 6 relative to the analogous path through multiplexers 20, 26 and 28 and flip-flop 12 in FIG. 4. However, tri-state inverter 62 inverts the logical polarity of the complex flip-flop 60 which requires that the design software for an FPGA implementing such a circuit have the ability to compensate for the logic inversions that it introduces.

Persons skilled in the art will realize that many different flip-flop circuits are known in the art and will understand that the choice of the exemplary circuits shown in FIG. 7 is in no way limiting.

Figure 8B:
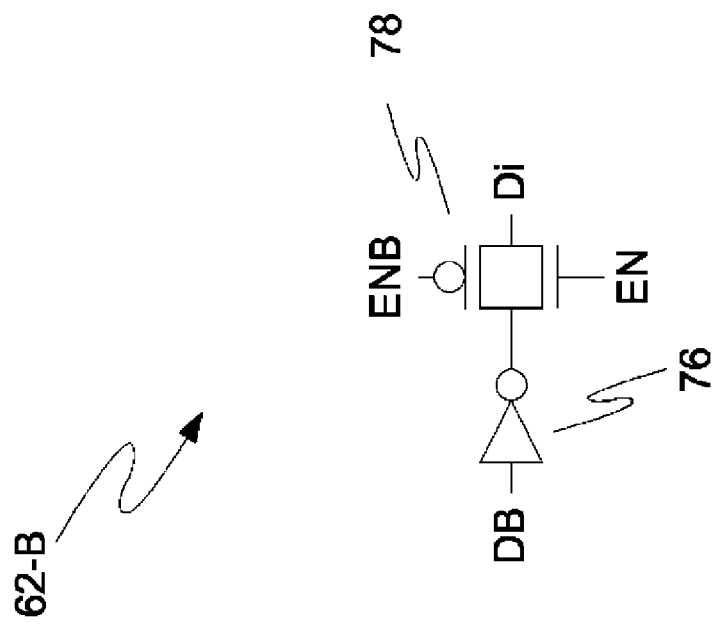
FIG. 8B shows a second exemplary implementation of the tri-state inverter of FIG. 7.
Figure 8A:
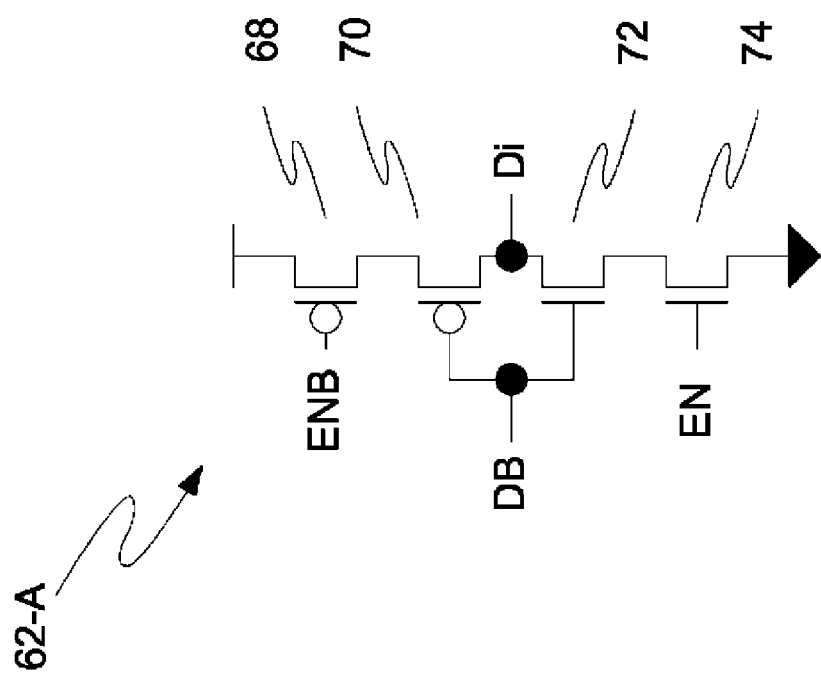
FIG. 8A shows a first exemplary implementation of the tri-state inverter of FIG. 7.

FIG. 8A shows, as indicated generally by reference number 62-A, a first exemplary implementation of the tri-state inverter 62 of FIG. 7. Circuit 62-A comprises PMOS transistors 68 and 70 and NMOS transistors 72 and 74. PMOS transistor 68 has a source node coupled to VCC, a gate node coupled to the ENB signal, and a drain node coupled to the source node of PMOS transistor 70. PMOS transistor 70 has a source node coupled to the drain node of PMOS transistor

68, a gate node coupled to the gate node of NMOS transistor 72 and the input node DB, and a drain node coupled to the drain node of NMOS transistor 72 and the output node Di. NMOS transistor 72 has a source node coupled to the drain node of NMOS transistor 74, a gate node coupled to the gate node of PMOS transistor 70 and the input node DB, and a drain node coupled to the drain node of PMOS transistor 70 and the output node Di. NMOS transistor 74 has a source node coupled to ground, a gate node coupled to the EN signal, and a drain node coupled to the source node of NMOS transistor 72.

When EN is at logic-1 and ENB is at logic-0, the transistors 68 and 74 are both on and the transistors 70 and 72 act as a CMOS inverter passing the logical complement of the signal on DB to the node Di. When EN is at logic-0 and ENB is at logic-1, the transistors 68 and 74 are both off and high impedance is presented to the node Di.

FIG. 8B shows, as indicated generally by reference number 62-B, a second exemplary implementation of the tri-state inverter 62 of FIG. 7. Circuit 62-B comprises inverter 76 and transmission gate 78. The input of inverter 76 has an input node that is coupled to the DB signal and an output node that is coupled to the input of transmission gate 78. Transmission gate 78 has a input node coupled to the output of inverter 76, a non-inverting enable input coupled to the EN signal, an inverting enable input coupled to the ENB signal, and an output node coupled to the Di signal.

When EN is at logic-1 and ENB is at logic-0, transmission gate 78 is open and passes the logical complement of the signal on DB at the output of inverter 76 to the node Di. When EN is at logic-0 and ENB is at logic-1, transmission gate 78 is closed and high impedance is presented to the node Di.

Persons of ordinary skill in the art will realize there are other ways to implement tri-state inverter 62 and the examples chosen in FIG. 8A and FIG. 8B are exemplary only and in no way limiting.

Since the use of inverting FPGA flip-flops is unknown in the prior art, it is required that the design software for an FPGA implementing such a circuit be adapted to have the ability to compensate for the logic inversions that it introduces. One possible solution would be to let users design using the inverting flip-flop. Unfortunately, virtually all FPGA designers (and logic designers in general) think in terms of non-inverting flip-flops, and trying to force customers to think in an unfamiliar manner is commercially unwise. A more practical approach is to hide the use of the inverting flip-flops inside the design software and then compensate for the logic inversion in the flip-flops while post-processing the end user design.

Figure 9A:
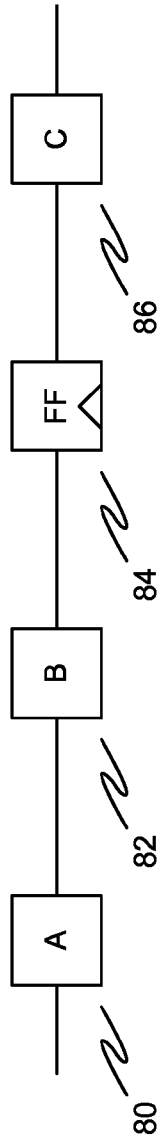
FIG. 9A shows a first exemplary portion of an end user design.

FIG. 9A shows an illustrative portion of a typical end user logic design to be implemented in an FPGA. Logic module 80 is shown implementing Boolean function A with its output coupled to an input on logic module 82. Logic module 82 is shown implementing Boolean function B with its output coupled to the data input of a standard non-inverting flip-flop 84. Flip-flop 84 has a data output coupled to an input on logic module 86 shown implementing Boolean Function C.

Figure 9B:
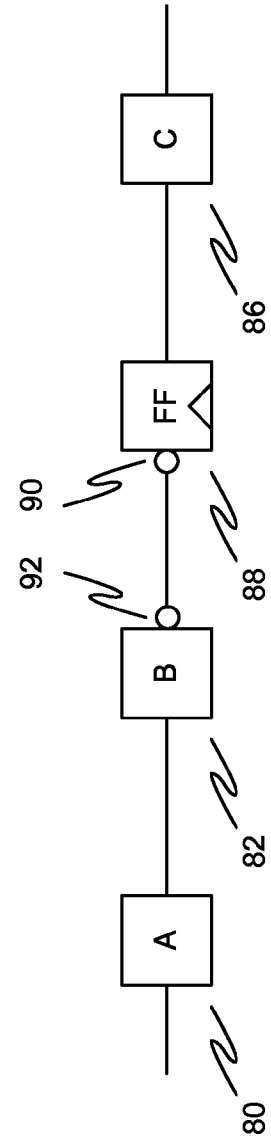
FIG. 9B shows a first transformation of the portion of an end user design of FIG. 9A.

FIG. 9B shows the transformation of the logic design of FIG. 9A into a logically identical representation. Logic modules 80, 82 and 86 are still present and still implementing Boolean functions A, B and C respectively. Inverting flip-flop 88 is shown replacing non-inverting flip-flop 84. The input inversion (like that of complex flip-flop 60 of FIG. 6 and FIG. 7) is indicated by inversion bubble 90. In order to keep the logic identical, a compensating inversion bubble 92 is shown on the output of logic module 82.

The logical representation of FIG. 9B is an abstraction created in the design software to realize the end user design in physically available programmable elements. Unless, for example, logic module 82 has an inverting output that the interconnect between logic module 82 and inverting flip-flop 88 can be rerouted to, further transformation of the representation of FIG. 9B is required.

Figure 9C:
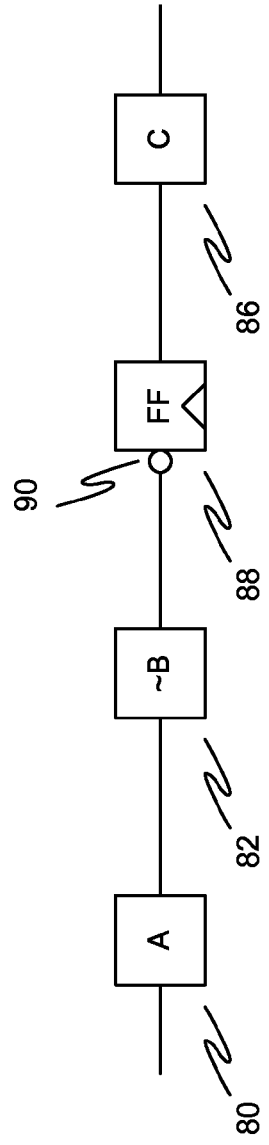
FIG. 9C shows a second transformation of the portion of an end user design of FIG. 9A.

FIG. 9C shows the transformation of the representation of FIG. 9B into a form that can be physically realized in an FPGA. Logic modules 80, 82 and 86 and inverting flip-flop 88 with its inverting data input 90 are still present. However, the Boolean function implemented in logic module 82 is now ~B which is the logical complement of the original Boolean function B. In an FPGA which uses look-up tables for function generators this is a very simple transformation.

In some FPGAs, where different sorts of function generators are used, the transformation can be more complicated if the function ~B is not available from logic module 82. In such cases, the entire logic function implemented by logic modules 80, 82 and any other logic modules and flip-flops (not shown) can be transformed into a Boolean equivalent function of a different topology. When designing an FPGA with an inverting flip-flop, it is highly desirable to incorporate function generators that work conveniently with the sorts of transformations necessary in the design software used for programming it.

FIG. 10A shows another illustrative portion of a typical end user design. Logic module 94 is shown implementing Boolean function D with its output coupled to an input on logic module 96. Logic module 96 is shown implementing Boolean function E with its output coupled to the data input of a standard non-inverting flip-flop 98. Flip-flop 98 has a data output coupled to an input on logic module 100 shown implementing Boolean function G.

FIG. 10B shows the transformation of the logic design of FIG. 10A into a logically identical representation. Logic modules 94, 96 and 100 are still present and still implementing Boolean functions D, E and G respectively. Inverting flip-flop 104 is shown replacing non-inverting flip-flop 98. The input inversion (like that of complex flip-flop 60 of FIG. 6 and FIG. 7) is indicated by inversion bubble 106. In order to keep the logic identical, a compensating inversion bubble 108 is shown on the output of inverting flip-flop 104.

The logical representation of FIG. 10B is an abstraction created in the design software to realize the end user design in physically available programmable elements. Unless, for example, flip-flop 104 has an inverting output that the interconnect between flip-flop 104 and logic module 100 can be rerouted to, further transformation of the representation of FIG. 10B is required.

FIG. 10C shows the transformation of the representation of FIG. 10B into a second logically identical representation. Logic modules 94, 96 and 100 are still present and still implementing Boolean functions D, E and G respectively. Inverting flip-flop 104 is shown replacing non-inverting flip-flop 98. The input inversion (like that of complex flip-flop 60 of FIG. 6 and FIG. 7) is indicated by inversion bubble 106. In order to keep the logic identical, a compensating inversion bubble 110 is shown on the input of logic module 100 replacing the compensating inversion bubble 108.

The logical representation of FIG. 10C is also an abstraction created in the design software as a means towards realizing the end user design in physically available programmable elements. Unless, for example, logic module 100 has an inverting input that the interconnect between flip-flop 104 and logic module 100 can be rerouted to, further transformation of the representation of FIG. 10C is required.

FIG. 10D shows the transformation of the representation of FIG. 10C into a form that can be physically realized in an FPGA. Logic modules 94, 96 and 100 and inverting flip-flop 104 with its inverting data input 106 are still present. However, the Boolean function implemented in logic module 100 is now G' which is the logical equivalent of the original Boolean function G with an inversion on the input coupled to inverting flip-flop 104. In an FPGA which uses look-up tables for function generators this is a very simple transformation.

Persons of ordinary skill in the art will appreciate that the examples shown in FIG. 9A through FIG. 10D are exemplary and in no way limiting. When transforming Boolean functions many different approaches can be taken and other such transformations will readily suggest themselves to such skilled persons.

Figure 11:
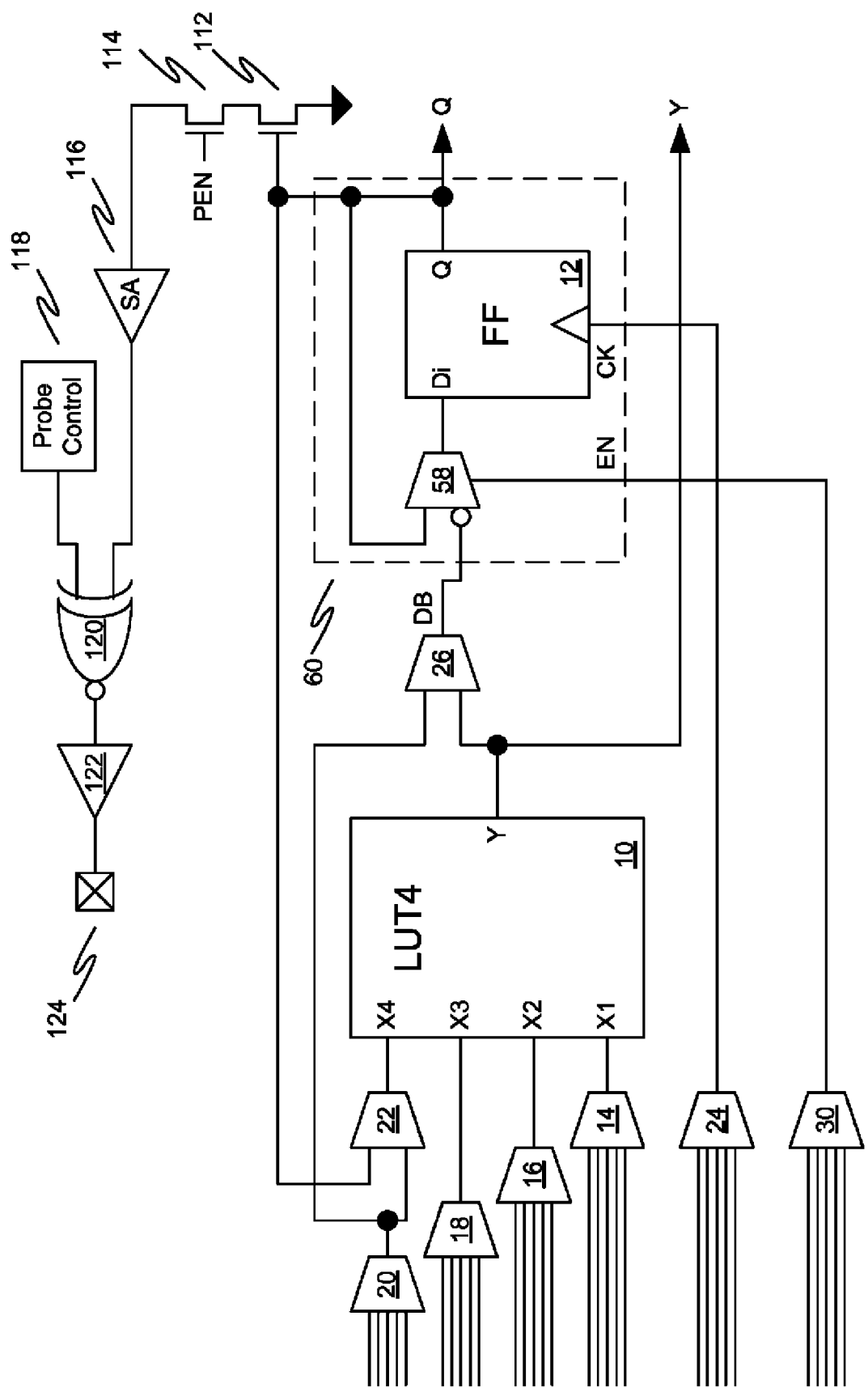
FIG. 11 shows a function generator in a configuration with a flip-flop of the present invention coupled to a probe circuit.

Some FPGAs have probe circuits which can be used by the end user to monitor logic signals internal to the FPGA, primarily for debugging a design. Such a scheme is shown in FIG. 11. Shown in FIG. 11 are function generator 10, complex flip-flop 60, and multiplexers 14, 16, 18, 20, 22, 24, 26 and 30 previously discussed. The probe circuit comprises NMOS transistors 112 and 114, sense amplifier 116, probe control circuit 118, XNOR gate 120, output buffer 122, and bond pad 124. NMOS transistors 112 and 114 are used to sense the output node Q of complex flip-flop 60. Since the gate of NMOS transistor 112 is coupled to Q, it will be either turned on when Q is at logic-1 or turned off when Q is at logic-0. Signal PEN (for Probe ENable) is coupled to the gate of NMOS transistor 14 providing the means to enable or disable the probe circuit. NMOS transistors 112 and 114 are local to the flip-flop 60 while all other circuits are shared amongst many different flip-flops.

Sense amplifier 116 is coupled to the drain of NMOS transistor 114. It may be directly coupled to a sense amp at the top of a column of flip-flops, or there may be multiplexing transistors (not shown) present to allow sharing the sense amp 116 with many different columns. XNOR-gate 120 has a first input coupled to the output of sense amplifier 116, a second input coupled to an output of probe control circuit 118, and an output coupled to the input of output buffer 122. Output buffer 122 has an output coupled to bond pad 124 for driving signals off of the FPGA integrated circuit device.

When the probe circuit is enabled, sense amplifier 116 will amplify the current supplied (or not supplied) by NMOS transistors 112 and 114. XNOR-gate 120 is used to control the polarity of the signal being sent off chip by output buffer 122 through bond pad 124. Probe control circuit 118 is coupled to a computer running the design software (through another off-chip connection not shown) that controls which flip-flop is being probed. Since the design software has the programming data available to it, it knows if the polarity of the output signal Q of the flip-flop being probed is inverted or not due to the transformations needed to compensate for the use of inverting flip-flops.

When using a probe for debugging purposes, the signal stored in a register is a very common thing for the end user to examine. If the flip-flop does not have the expected logic polarity at its output inverted, this can create a very confusing situation for the end user. The most expedient approach is to cancel out the inversions before they leave the FPGA at bond pad 124. In a presently preferred embodiment, all the flip-flop logic modules in the FPGA have probe circuits (though this is not true in all embodiments). Thus the flip-flop 60 is representative of all the flip-flop logic modules in the FPGA including flip-flops 84 and 88 in FIGS. 9A through 9C and flip-flops 98 and 104 in FIGS. 10A through 10D.

In the example of FIGS. 9A, 9B and 9C, the logic sense of the flip-flop 88 is exactly the same as the output of the original flip-flop 84 and no inversion in XNOR-gate 120 is needed for probing. However, in the example of FIGS. 10A, 10B, 10C and 10D, the output of the flip-flop 104 is inverted relative to flip-flop 98 and needs to be inverted again in XNOR-gate 120 to restore the correct polarity for probing.

Persons skilled in the art will realize that there are many different ways to build a probe system for an FPGA, and that the choice of the circuit presented in FIG. 11 is exemplary only and in no way limiting.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A circuit disposed in a programmable logic integrated circuit device, and coupled to a programmable logic routing fabric, the circuit comprising:
   a logic function generator element including a plurality of data inputs and an output;
   a first multiplexer having a first data input, a second data input, a control input, and an output, the output coupled to a first data input of the logic function generator element;
   a second multiplexer having a first data input coupled to the output of the logic function generator element, a second data input coupled to the second data input of the first multiplexer, a control input, and an output;
   a clocked data storage element having a clock input, a data input, and a data output, the data output coupled to the first data input of the first multiplexer; and
   a third multiplexer having a non-inverting first data input coupled to the output of the clocked data storage element, an inverting second data input coupled to the output of the second multiplexer, a control input, and an output coupled to the data input of the clocked data storage element.

2. The circuit of claim 1, further including a fourth multiplexer having a plurality of data inputs coupled to the programmable logic routing fabric, a control input, and an output coupled to the control input of the third multiplexer.

3. The circuit of claim 1, further including a fifth multiplexer having a plurality of data inputs coupled to the programmable logic routing fabric, a control input, and an output coupled to the clock input of the clocked data storage element.

4. The circuit of claim 1, further including a sixth multiplexer having a plurality of data inputs coupled to the programmable logic routing fabric, a control input, and an output coupled to the second data inputs of the first and second multiplexers.

5. The circuit of claim 4, further including a seventh multiplexer having a plurality of data inputs coupled to the programmable logic routing fabric, a control input, and an output coupled to a third data input of the logic function generator.

6. The circuit of claim 5, further including a eighth multiplexer having a plurality of data inputs coupled to the programmable logic routing fabric, a control input, and an output coupled to a fourth data input of the logic function generator.

7. The circuit of claim 1 wherein the function generator element is a lookup table.

8. The circuit of claim 1 wherein the clocked data storage element is a data flip-flop.

9. The circuit of claim 1, further comprising a probe circuit coupled to the data output of the data flip-flop.

10. The circuit of claim 1, further including:
   a data output node coupled to the output of the logic function generator; and
   a clocked data output node coupled to the data output of the clocked data storage element.

11. The circuit of claim 1, further including a probe circuit having a probe input coupled to the output of the clocked data storage element and a probe output.

12. The circuit of claim 11 wherein the probe output is coupled to an I/O pad of the programmable logic integrated circuit device.

13. The circuit of claim 11 wherein the probe circuit includes:
   a probe-enable switch coupled to the output of the clocked data storage element;
   a probe control element;
   a NOR gate having a first data input coupled to the probe control element, a second data input coupled to the probe-enable switch, and an output coupled to the probe output.

14. The circuit of claim 11 wherein the probe circuit includes:
   a first transistor having a gate coupled to the output of the clocked data storage element, a source coupled to ground, and a drain;
   a second transistor having a gate coupled to a source of a probe enable signal, a source coupled to the drain of the first transistor, and a drain;
   a probe control element;
   a NOR gate having a first data input coupled to the probe control element, a second data input coupled to the drain of the second transistor, and an output coupled to the probe output.

15. The circuit of claim 14 wherein:
   the second data input of the NOR gate is coupled to the drain of the second transistor through a sense amplifier, and
   the output of the NOR gate is coupled to an I/O pad of the programmable logic integrated circuit device through a buffer.

* * * * *